(12) United States Patent
Walker

(10) Patent No.: US 8,903,698 B2
(45) Date of Patent: Dec. 2, 2014

(54) GENERATING BEHAVIORAL MODELS FOR ANALOG CIRCUITS

(75) Inventor: William W. Walker, Los Gatos, CA (US)

(73) Assignee: Fujitsu Limited, Kawasaki (JP)

(*) Notice: Subject to any disclaimer, the term of this patent is extended or adjusted under 35 U.S.C. 154(b) by 406 days.

(21) Appl. No.: 13/472,060

(22) Filed: May 15, 2012

(65) Prior Publication Data
US 2013/0311152 A1 Nov. 21, 2013

(51) Int. Cl.
*G06F 17/50* (2006.01)

(52) U.S. Cl.
CPC ........ *G06F 17/5036* (2013.01); *G06F 17/5063* (2013.01)
USPC .......................................................... 703/14

(58) Field of Classification Search
CPC ......... G06F 19/00; G06F 17/50; G06F 17/11; G06F 9/455; G06F 17/5036; G06F 17/5068; G06F 9/45; G06F 9/44; G06F 17/10; G06F 7/38; G06F 11/00; G06F 17/5063; G06N 3/12; G06G 7/62; G06G 7/00; G06G 7/28; G06G 7/48; G01R 31/28; G11C 27/00; H01L 29/772; H01L 29/06; H03K 19/177; H03K 19/20; H03M 7/34; H03M 7/38; H03M 7/00; H04B 17/00; H01R 12/00; H05K 1/00
USPC ......... 703/2, 4, 14, 26; 700/97; 716/102, 113; 257/255
See application file for complete search history.

(56) References Cited

U.S. PATENT DOCUMENTS

| | | | |
|---|---|---|---|
| 5,222,030 A | 6/1993 | Dangelo et al. | |
| 5,493,507 A * | 2/1996 | Shinde et al. | 703/14 |
| 5,572,437 A | 11/1996 | Rostoker et al. | |
| 6,470,482 B1 | 10/2002 | Rostoker et al. | |
| 6,480,816 B1 | 11/2002 | Dhar | |
| 6,898,767 B2 | 5/2005 | Halstead | |
| 7,269,809 B2 | 9/2007 | Shastri et al. | |
| 8,201,137 B1 | 6/2012 | Bhushan et al. | |
| 8,543,372 B1 * | 9/2013 | Fernandez et al. | 703/26 |
| 2005/0257178 A1* | 11/2005 | Daems et al. | 716/2 |
| 2006/0015829 A1* | 1/2006 | De Smedt et al. | 716/2 |
| 2006/0184344 A1* | 8/2006 | Heo | 703/4 |
| 2009/0228849 A1* | 9/2009 | Mossawir et al. | 716/5 |

(Continued)

OTHER PUBLICATIONS

"Virtuoso Aptivia Characterization and Modeling," Datasheet, Cadence Design Systems, 2003, <http://w2.cadence.com/datasheets/4923_VirtuosoCharMod_DSfnl.pdf>.

(Continued)

*Primary Examiner* — Kandasamy Thangavelu
(74) *Attorney, Agent, or Firm* — Maschoff Brennan

(57) ABSTRACT

A system for generating behavioral models for analog circuits may include a database that is configured to store a parameterized hardware description language model of an analog circuit and an analog circuit simulator template of the analog circuit. The system may also include an interface module configured to receive data for an instance of the analog circuit in a schematic format. The system may also include an analog circuit simulator configured to use the received data and the analog circuit simulator template to generate a value for a parameter of the parameterized hardware description language model of the analog circuit. The system may also include a model constructor configured to generate a behavioral hardware description language model of the instance of the analog circuit based on the parameterized hardware description language model of the analog circuit and the generated value.

20 Claims, 4 Drawing Sheets

(56) References Cited

U.S. PATENT DOCUMENTS

| | | | |
|---|---|---|---|
| 2010/0031206 A1* | 2/2010 | Wu et al. | 716/2 |
| 2010/0270597 A1* | 10/2010 | Sproch et al. | 257/255 |
| 2010/0286807 A1* | 11/2010 | Chen | 700/97 |
| 2012/0253776 A1* | 10/2012 | Takizawa | 703/14 |
| 2013/0006595 A1 | 1/2013 | Reddy et al. | |
| 2013/0007677 A1* | 1/2013 | Nilkund | 716/102 |
| 2013/0226535 A1* | 8/2013 | Tuan | 703/2 |
| 2013/0275936 A1* | 10/2013 | Abhishek et al. | 716/113 |

OTHER PUBLICATIONS

Borchers et al., "Equation-Based Behavioral Model Generation for Nonlinear Analog Circuits", Institute of Microelectronic Systems, 33rd Design Automation Conference, 1996 ACM, Inc.

\* cited by examiner

GENERATING BEHAVIORAL MODELS FOR ANALOG CIRCUITS

FIELD

The embodiments discussed herein are related to analog circuit design.

BACKGROUND

Designing analog or mixed signal circuits may include verifying the functionality of the circuits before the circuits are physically constructed. Verifying the functionality of the circuits before constructing the circuits allows circuit designers to discover any flaws or problems with the design. Eliminating flaws or problems with a design before circuit construction may reduce costs and the time to finalize the circuit design.

To verify the design of mixed signal circuits and analog circuits, the behavior of the analog components of the circuits may first be modeled using a hardware descriptive language (HDL). After capturing the behavior of the analog circuit components of the mixed signal or analog circuits, the functionality of the circuits may be verified. Manually modeling analog components using an HDL and verifying the models may be difficult, time-consuming, subject to discrepancies between designs, and in some circumstances may only be accomplished by specialists with a high level of expertise.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a system for generating behavioral models for analog circuits may include a database that is configured to store a parameterized hardware description language model of an analog circuit and an analog circuit simulator template of the analog circuit. The system may also include an interface module configured to receive data for an instance of the analog circuit in a schematic format. The system may also include an analog circuit simulator configured to use the received data and the analog circuit simulator template to generate a value for a parameter of the parameterized hardware description language model of the analog circuit. The system may also include a model constructor configured to generate a behavioral hardware description language model of the instance of the analog circuit based on the parameterized hardware description language model of the analog circuit and the generated value.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

Some embodiments described herein may include a system for generating behavioral models for analog circuits. The system may include a model database that includes parameterized hardware description language (HDL) models of analog circuits and multiple analog circuit simulator templates for each of the analog circuits. The system may also include an interface configured to receive data, for example, from a user of the system, for an instance of an analog circuit in a schematic format. The system may be configured to allow the user of the system to select from a menu, within the interface, an analog circuit type that corresponds to the type of the analog circuit for which data is received. Based on the selected analog circuit type, an analog circuit simulator may be configured to use the analog circuit simulator templates for the selected analog circuit type along with the received data from the user to generate a value for each parameter of a parameterized HDL model that corresponds to the selected analog circuit type. The system may also include a model constructor configured to create a behavioral HDL model of the instance of the analog circuit based on the parameterized HDL model and the generated values for the parameters. The behavioral HDL model of the analog circuit may be used by circuit design verification software to verify a circuit design that incorporates the analog circuit, for example a mixed signal design including both analog and digital circuits.

Embodiments of the present invention will be explained with reference to the accompanying drawings.

Figure 1:
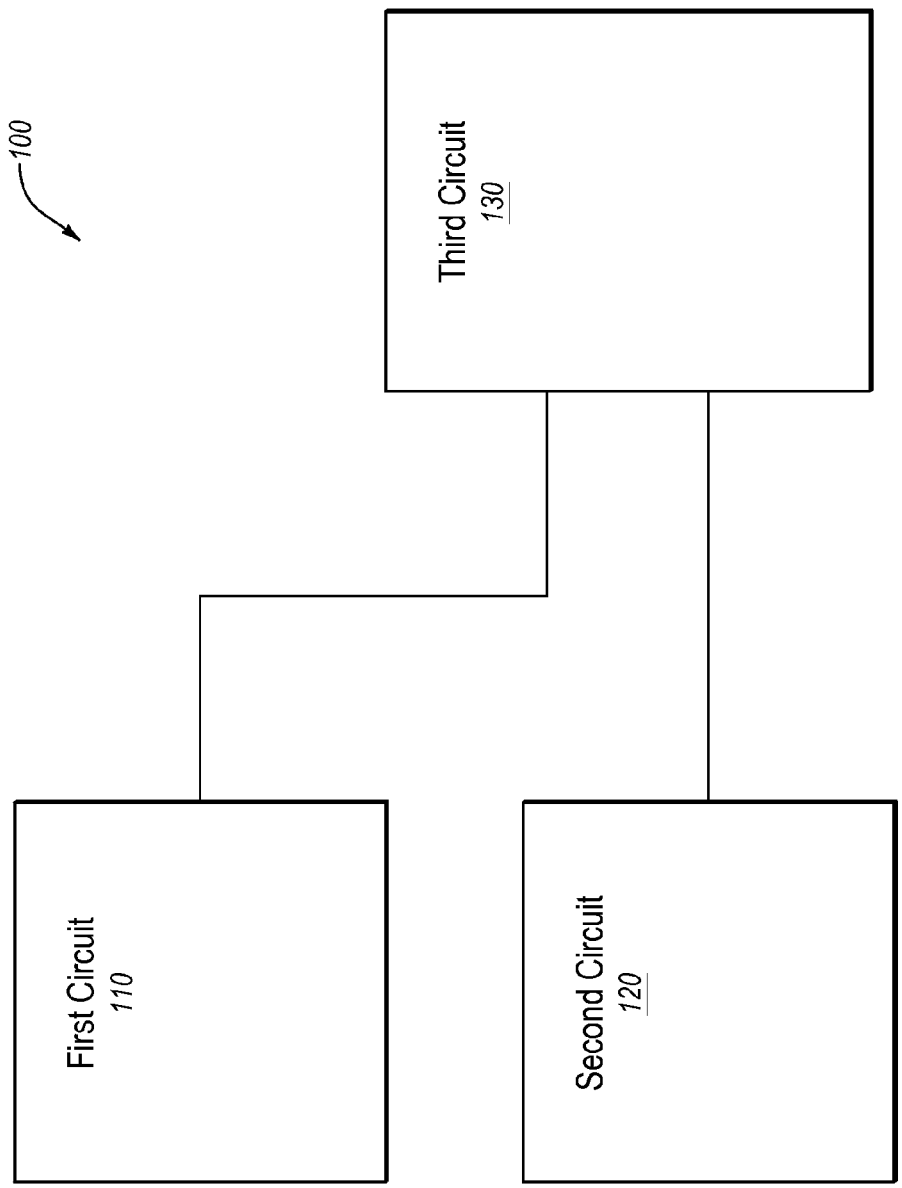
FIG. 1 illustrates an example system with circuit components.

FIG. 1 illustrates an example system 100 with circuit components, arranged in accordance with at least some embodiments described herein. The circuit components within the system may include a first circuit 110, a second circuit 120, and a third circuit 130. The first and second circuits 110, 120 may be coupled to the third circuit 130. In some embodiments, the first and second circuit 110, 120 may be coupled as well.

The first and second circuits 110, 120 may be analog circuits and the third circuit 130 may be a digital circuit. The first and second circuits 110, 120 may be the same type of circuit or different types of circuits. In some embodiments, each of the first and second circuits 110, 120 may be one of the following types of analog circuits: a phase frequency detector (PFD), a mixer, a voltage controlled oscillator (VCO), a phase detector, a loop filters, a frequency divider, an analog to digital converter (ADC), a digital to analog converter (DAC), a passive analog filter, a phase interpolator (PI), a low noise amplifier (LNA), a continuous time linear equalizer (CTLE), a transimpedance amplifier (TIA), an automatic gain control amplifier (AGCA), a linear amplifier (LA), a feed forward equalizer (FFE), a phase locked loop (PLL), among others.

The behavior of the first and second circuits 110, 120 may be modeled using an HDL. The HDL may be, for example, veriloga, AHDL, spectreHDL, verilog-AMS, HDL-A, among others. An HDL model of the first and second circuits 110, 120 may contain statements, equations, and other logic relations to model the behavior of the first and second circuits 110, 120.

In some embodiments, an HDL model for an analog circuit may be parameterized. A parameterized HDL model may be a generic HDL model for a type of analog circuit that has placeholders for values of parameters used to fully characterize the analog circuit. The equations and logic relations between the parameters and how the different parameters affect the behavior of the analog circuit may be established in the parameterized HDL model. Adding the values for parameters of a specific implementation of the analog circuit to the parameterized HDL model may allow the behavior of the specific implementation of the analog circuit to be modeled. For example, a parameterized HDL model may generically describe the operation of a digitally tuned VCO. The parameters of the parameterized HDL model for the VCO may include, but are not limited to, time delay, power consumption, voltage operating points, number of operating bands, frequency of the operating bands, frequency gain, offset voltages, and frequency bandwidth. When specific values for parameters of a specific implementation of a VCO circuit are included in the parameterized HDL model, the parameterized HDL model may be used to model the behavior of the specific implementation of the VCO circuit. Parameterized HDL models may be formed based on the operation and behavior of the analog circuits that they model. In some embodiments, a parameterized HDL model for a type of analog circuit may be formed by an expert in analog circuit modeling.

To obtain values for parameters of an instance of an analog circuit, the analog circuit may be modeled and simulated using an analog circuit simulator. The analog circuit simulator may be a type of SPICE program, such as, PSPICE, HSPICE, ISPICE, XSPICE, CIDER, Spectre, BDASIM, among others, that simulates analog circuits on a transistor level. To simulate an analog circuit, the analog circuit simulator may use an instance of the analog circuit in a schematic format and an analog circuit simulator template. The instance of the analog circuit in the schematic format may include component data. The component data may indicate the transistor-level analog components within the analog circuit and how the analog components are connected. For example, the component data may indicate the types of transistors, resistors, capacitors, diodes, inductors, and other analog components within the analog circuit and how the components are connected. The analog circuit simulator template may include simulation information. The simulation information may include stimulus values, value measurement locations, types of analysis, and/or other simulation information used by the analog circuit simulator to generate the values for the parameters of the analog circuit. In some embodiments, an analog circuit simulator template for a type of analog circuit may be formed by an expert in analog circuit modeling.

In addition to using the analog circuit simulator template and the instance of the analog circuit in the schematic format, the analog circuit simulator may use modeling data for the instance of the analog circuit to generate values for parameters of the analog circuit. The modeling data for the instance of the analog circuit may be inputs to the analog circuit or describe set characteristics of the analog circuit. For example, if the analog circuit is a digitally tuned VCO, the modeling data for the VCO may include the operating bandwidth, the voltage level of the power supply, and the number of operating bands.

In some embodiments, multiple analog circuit simulator templates may be used to generate values for parameters of an instance of an analog circuit. Each of the multiple analog circuit simulator templates may be used to generate values for different parameters. For example, a first analog circuit simulator template may be configured to generate a value for each of one or more parameters related to an AC analysis of an instance of an analog circuit. A second circuit simulator template may be configured to generate values for each of one or more parameters related to a DC analysis, a DC transfer curve analysis, a noise analysis, a transient analysis, parametric sweeps, loop gain, stability calculations, harmonic balances, time domain steady state analysis, and/or other analyses of the instance of the analog circuit. The analog circuit simulator may use each of the multiple analog circuit simulator templates at separate times or at the same time.

In some embodiments, the first, second, and third circuits 110, 120, 130 may have sub-circuits. For example, the first circuit 110 may be a PLL and may have sub-circuits such as a VCO and a PFD. In these and other embodiments, the behavior of each of the sub-circuits may be modeled independently using a parameterized HDL model. Thus, each sub-circuit may include a parameterized HDL model and one or more analog circuit simulator templates. The combination of the parameterized HDL models of the sub-circuits may be used to model the behavior of the first circuit 110.

Figure 2:
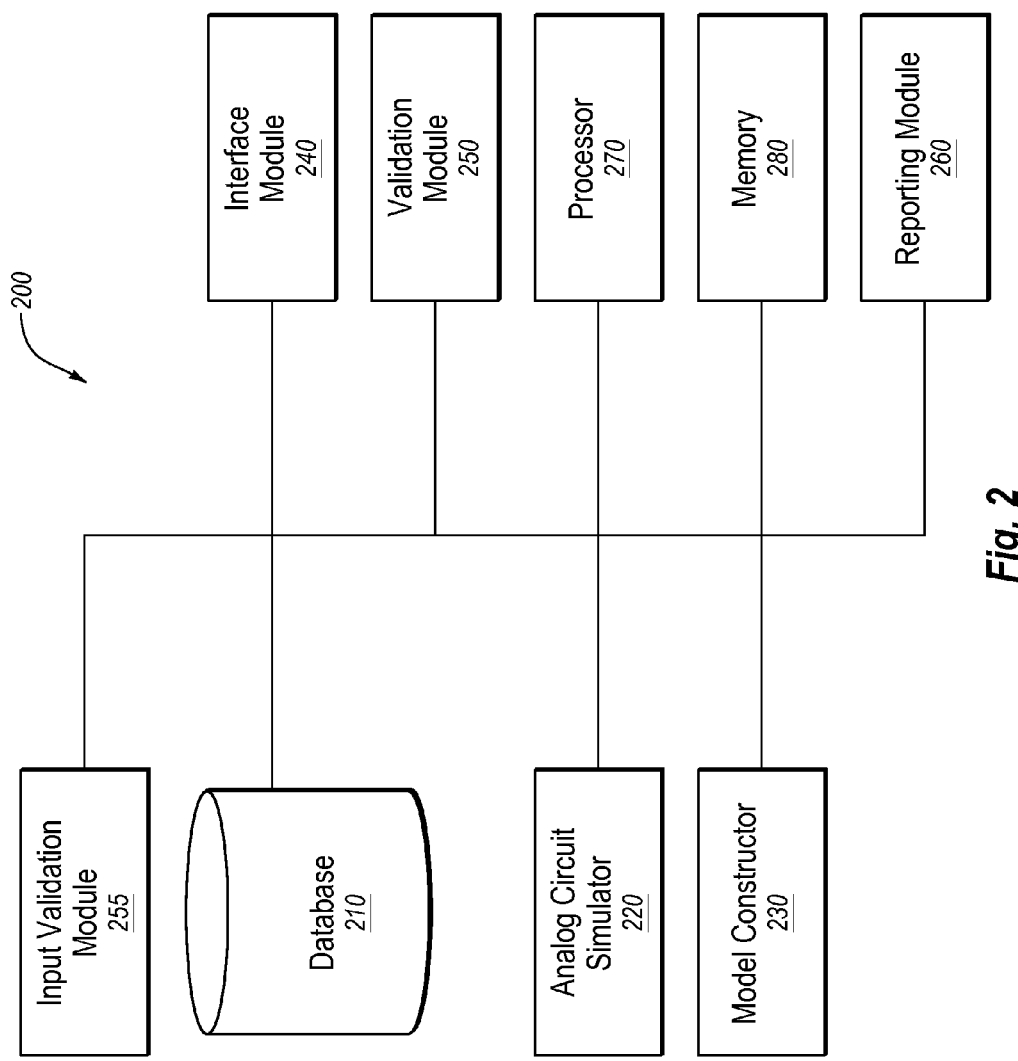
FIG. 2 is a block diagram of an example system for generating behavioral models for analog circuits.

FIG. 2 is a block diagram of an example system 200 for generating behavioral models for analog circuits, arranged in accordance with at least some embodiments described herein. The system 200 may be configured to generate behavioral models for analog circuits. The system 200 may include a database 210, an analog circuit simulator 220, a model constructor 230, an interface module 240, a validation module 250, an input validation module 255, a reporting module 260, a processor 270, and a memory 280.

The database 210 may be configured to store a parameterized HDL model for each of one or more types of analog circuits. For example, the database 210 may store parameterized HDL models for one or more of the following types of analog circuits: a PFD, a mixer, a VCO, a phase detector, a loop filter, a frequency divider, an ADC, a DAC, a passive analog filter, a PI, a LNA, a CTLE, a TIA, an AGCA, a LA, a FFE, a PLL, among others. The parameterized HDL model stored in the database 210 for each type of analog circuit may be similar to the parameterized HDL models discussed with respect to FIG. 1.

The database 210 may also be configured to store one or more analog circuit simulator templates for each stored parameterized HDL model. The analog circuit simulator templates may be similar to the analog circuit simulator templates discussed with respect to FIG. 1.

The interface module 240 may be configured to receive data for an instance of an analog circuit in a schematic format. In some embodiments, the interface module 240 may include a graphic user interface (GUI) that allows for a schematic representation of the instance of the analog circuit to be drawn. Alternately or additionally, the interface module 240 may include a non-GUI that may receive a script or other written representation of the instance of the analog circuit. In some embodiments, the interface module may receive the data for the instance of the analog circuit from a user of the system 200 or from some other source.

Figure 3:
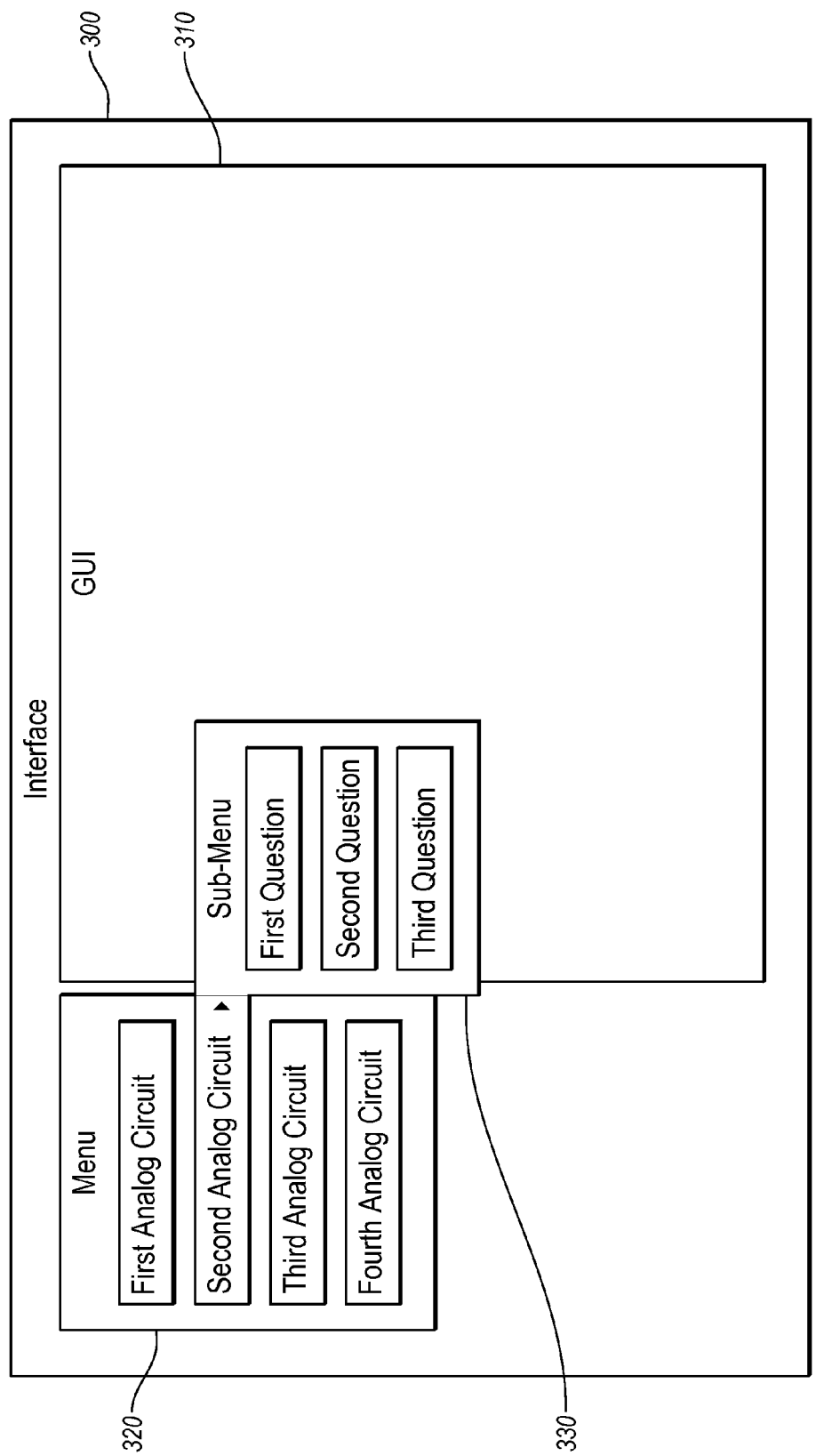
FIG. 3 illustrates an example interface configured to receive data for an analog circuit.

The interface module 240 may also be configured to receive an indication of a type of the instantiated analog circuit. The instance of the analog circuit for which data is received through the interface module 240 may be referred to herein as the instantiated analog circuit. To receive an indication of a type of the instantiated analog circuit, the interface module 240 may be configured to present the types of analog circuits for which the system 200 may generate a behavioral model and allow for a selection from the presented types of analog circuit. The selected type of analog circuit may indicate the type of the instantiated analog circuit. For example, the interface module 240 may present the types of analog circuits in a menu format as illustrated in FIG. 3 and receive an indication of a type of the instantiated analog circuit by a user selecting the type of instantiated analog circuit from the menu. The interface module 240 may determine the types of analog circuits to present based on the parameterized HDL models of analog circuits in the database 210.

The interface module 240 may also be configured to receive modeling data for the instantiated analog circuit. The interface module 240 may receive the modeling data through a GUI, a script, or in some other manner. In some embodiments, the interface module 240 may present a prompt for specific modeling data. For example, the interface module 240 may present a sub-menu, as illustrated in FIG. 3, that contains fields for receiving specific modeling data for a type of analog circuit.

The modeling data may be used to determine values for parameters of the parameterized HDL models. For example, if the instantiated analog circuit is a digitally tuned VCO, the modeling data may include the operating bandwidth, the voltage level of the power supply, and the number of operating bands of the VCO. The modeling data may further include information to link ports of the instance of the analog circuit with ports of the selected parameterized HDL model. Linking the ports of the instance of the analog circuit with the ports of the selected parameterized HDL model may assist in generating values for the parameters of the parameterized HDL model.

In some embodiments, the input validation module 255 may be configured to validate the data received regarding the instance of the analog circuit (i.e. the received data) and the modeling data. For example, the validation module 250 may validate the received data and the modeling data by determining if the data contains an error. Some received data errors may include improper naming of ports, names of ports not correlating between the received data and the modeling data, the received data not supporting a creation of a net-list, among others. Some modeling data errors may include names of ports not correlating between the modeling data and the received data, values of the modeling data being outside predetermined bounds, among others. When the validation module 250 determines that the received data and/or the modeling data contains an error, the validation module 250 may send the error to the reporting module 260. The reporting module 260 may be configured to report an error. In some embodiments, the reporting module 260 may be configured to report the specific error.

The analog circuit simulator 220 may be configured to use the analog circuit simulator templates stored in the database 210 and the received data to generate values for parameters of the stored parameterized HDL models. For example, based on the indication of the type of the instantiated analog circuit received by the interface module 240, the analog circuit simulator 220 may select one or more analog circuit simulator templates that correspond to the indicated type of the instantiated analog circuit. For each selected analog circuit simulator template, the analog circuit simulator 220 may use the received data and the selected analog circuit simulator template to generate a value for each of one or more parameters of the parameterized HDL model that corresponds to the indicated type of the instantiated analog circuit. In some embodiments, the analog circuit simulator 220 may generate values for parameters of the stored parameterized HDL models using the analog circuit simulator templates stored in the database 210, the received data, and the modeling data received by the interface module 240. The analog circuit simulator 220 may be further configured to send the generated values to the model constructor 230.

The model constructor 230 may be configured to generate a behavioral HDL model of the instantiated analog circuit based on the parameterized HDL model that corresponds to the instantiated analog circuit and the values generated by the analog circuit simulator 220. The model constructor 230 may be configured to generate the behavioral HDL model by assigning the values generated by the analog circuit simulator for specific parameters to the correspond parameters in the parameterized HDL model. The behavioral HDL model may be used to model the behavior of the instantiated analog circuit. In some embodiments, the behavioral HDL model may be used by electronic design automation software to model the behavior of the instantiated analog circuit as well as the behavior of a system that includes the instantiated analog circuit. Modeling the behavior of the instantiated analog circuit and the system that includes the instantiated analog circuit may provide a manner for design verification of the system.

In some embodiments, the validation module 250 may be configured to validate a behavioral HDL model. The validation module 250 may validate a behavioral HDL model by comparing the modeled behavior of an analog circuit based on the behavioral HDL model with the modeled behavior of the analog circuit based on a transistor level model of the analog circuit. In some embodiments, the transistor level model of the analog circuit may be received through the interface module 240. For example, the transistor level model of the analog circuit may be a schematic format of an instance of the analog circuit for which the behavioral HDL model is created. If the difference between the modeled behavior based on the behavioral HDL model and the modeled behavior based on the transistor level model is below a threshold, the behavioral HDL model may be validated. The validation may indicate that the behavioral HDL model behaviorally models the analog circuit within a predetermined tolerance level.

If the difference between the modeled behavior based on the behavioral HDL model and the modeled behavior based on the transistor level model is above a threshold, the behavioral HDL model may fail validation and may not accurately behaviorally model the analog circuit. In some embodiment, the reporting module 260 may be configured to generate a report indicating the status of a validation of a behavioral HDL model of an analog circuit. In these and other embodiments, the generated report may include data relating to a comparison between the behavior modeling of the behavioral HDL model and the behavior modeling of a transistor level model of the analog circuit. In some embodiments, the report may include the values generated by the analog circuit simulator 220 that are used in generating the behavioral HDL model.

The processor 270 may be configured to execute computer instructions that cause the system 200 to perform the functions and operations described herein. The computer instructions may be loaded into the memory 280 for execution by the processor 270 and/or data generated, received, or operated on during performance of the functions and operations described herein may be at least temporarily stored in the memory 280.

In some embodiments, the system 200 may function in conjunction with electronic design automation software, such as electronic design automation software provided by companies such as Cadence Design Systems, Mentor Graphics, Synopsis, and other companies. In these and other embodiments, an instance of an analog circuit in schematic format may be provided by the electronic design automation software to the interface module 240 of the system 200. The interface module 240 may provide a menu for selection of the type of analog circuit that corresponds with the instantiated analog circuit. The interface module 240 may also provide for the system 200 to receive modeling data for the instantiated analog circuit. For the type of analog circuit selected, a corresponding parameterized HDL model may be selected. Values may be generated for the parameters of the parameterized HDL model using the instantiated analog circuit and an analog circuit simulator template. A behavior HDL model may also be generated based on the generated values and the selected parameterized HDL model. In some embodiments, validation of the behavior HDL model may be performed by the system 200 or the electronic design automation software. The behavior HDL model may be used by the electronic design automation software when validating or performing other functions on a system that incorporates the instantiated analog circuit. In some embodiments, the system 200 or some parts thereof may be included in an electronic design automation software package.

FIG. 3 illustrates an example interface 300 configured to receive data for an analog circuit, arranged in accordance with at least some embodiments described herein. The interface 300 may include a GUI 310, a menu 320 related to the GUI 310, and a sub-menu 330 of the menu 320.

The GUI 310 may be configured to provide a schematic representation of an instance of an analog circuit. The GUI 310 may also be configured to provide an icon and/or other symbol or manner for selection of the type of analog circuit schematically represented in the GUI 310. The interface 300 may display the menu 320 after the selection of the icon.

The menu 320 may list a selection of different types of analogs circuit for which a behavior model may be generated. For any selection of one of the analog circuits listed in the menu 320, the sub-menu 330 may be displayed by the interface 300. The sub-menu 330 may provide questions related to the selected analog circuit and fields for responses to allow the interface 300 to receive modeling data for the selected analog circuit.

The interface 300 is provided as an example interface that may be used to receive data for an analog circuit. Different configurations of interfaces and/or manners of receiving data for an analog circuit may be employed.

An example of the operations of the system 200 of FIG. 2 is now described with combined reference to FIGS. 2 and 3. The database 210 may contain parameterized HDL models for multiple types of analog circuits. The analog circuits may include a PFD, a mixer, a VCO, a phase detector, a loop filters, a frequency divider, an ADC, a DAC, a passive analog filter, a PI, a LNA, a CTLE, a TIA, an AGCA, a LA, and a FFE. The database 210 may also contain multiple analog circuit simulator templates for each of the different types of analog circuits. Each of the parameterized HDL models and the analog circuit simulator templates may have been created by an expert and stored in the database 210.

A user may interact with the GUI 310 to draw a schematic of an analog circuit. The schematic of the analog circuit may include, for example, input ports, output ports, and a power supply. The user may select an icon in the GUI 310 to cause the menu 320 to be displayed. The menu 320 may display the names of the different types of analog circuits for which a parameterized HDL model is stored in the database 210. The user may select a mixer as the type of analog circuit represented in the schematic drawn in the GUI 310.

The sub-menu 330 may be displayed on the interface 300 after the selection of the mixer from the menu 320. The sub-menu 330 may have fields for the user to input modeling data for the mixer, such as the names of the ports in the schematic, a voltage level of the power supply connected to the mixer, and frequency and voltage ranges for the input ports of the mixer. Using the modeling data, the schematic of an analog circuit and analog circuit simulator templates for the mixer, the analog circuit simulator 220 may generate values for the parameterized HDL model for the mixer.

The model constructor 230 may generate a behavior HDL model for the mixer by assigning the generated values to the corresponding parameters in the parameterized HDL model for the mixer.

Figure 4:
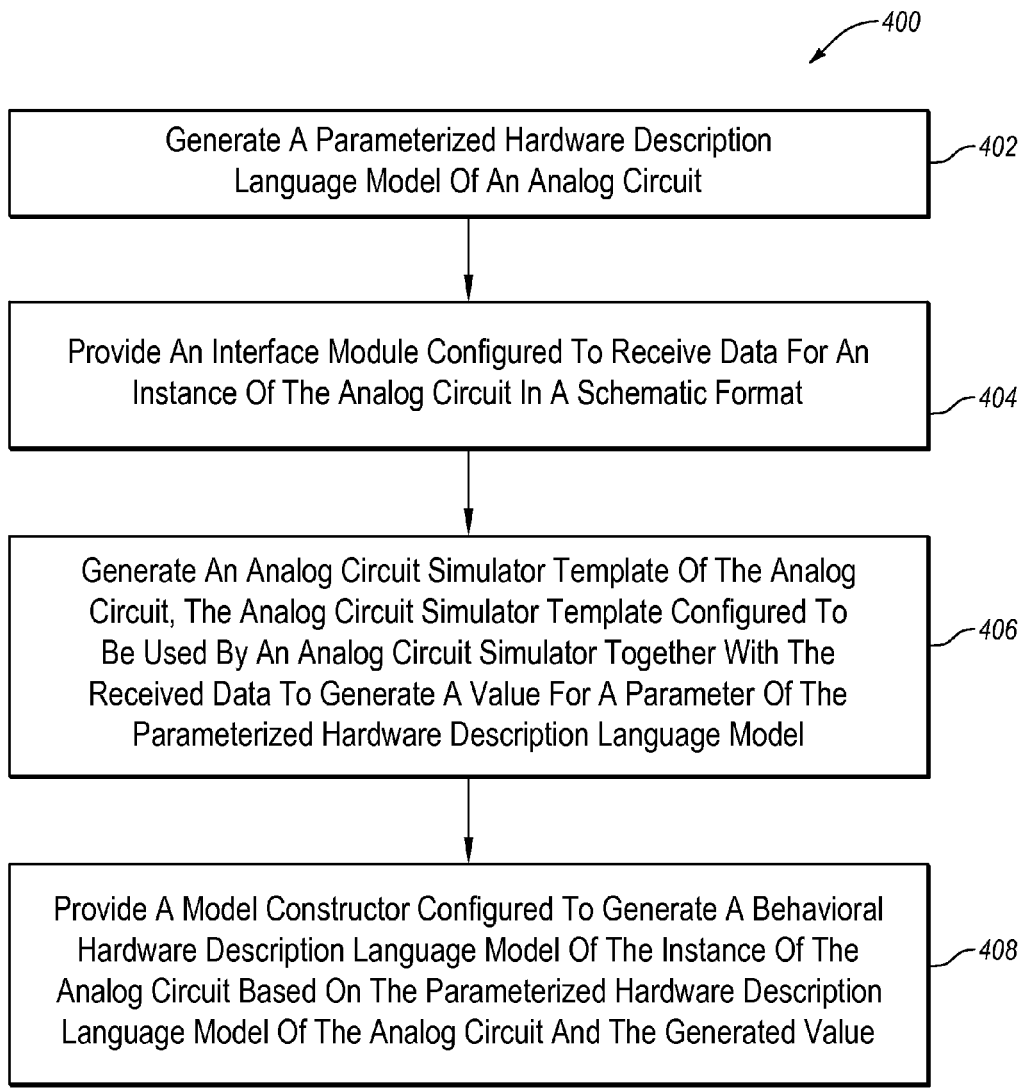
FIG. 4 is a flow chart of an example method of generating behavioral models for analog circuits, all arranged in accordance with at least some embodiments described herein.

FIG. 4 is a flow chart of an example method 400 of generating behavioral models for analog circuits, arranged in accordance with at least some embodiments described herein. The method 400 may be implemented, in some embodiments, by a system, such as the system 200 of FIG. 2. For instance, the processor 270 of the system 200 of FIG. 2 may be configured to execute computer instructions to perform operations for generating behavioral models for analog circuits as represented by one or more of blocks 402, 404, 406, and/or 408 of the method 400. Although illustrated as discrete blocks, various blocks may be divided into additional blocks, combined into fewer blocks, or eliminated, depending on the desired implementation.

The method 400 may begin at block 402, in which a parameterized HDL model of an analog circuit may be generated. The parameterized HDL model may be generated using any HDL, such as, but not limited to, veriloga, AHDL, spectre-HDL, verilog-AMS, and HDL-A. The parameterized HDL model may be a generic HDL model for the analog circuit that has placeholders for values of parameters used to fully characterize the analog circuit. The equations and logic relations between the parameters and how the different parameters affect the behavior of the analog circuit may be established in the parameterized HDL model. In some embodiments, the parameterized HDL model may be generated by an expert in HDL modeling. Alternately or additionally, the generated parameterized HDL model may be stored in a database, on a computer readable storage medium, or in some other form of static memory.

In block 404, an interface module configured to receive data for an instance of the analog circuit in a schematic format may be provided. In some embodiments, the interface module may include a GUI that allows for a schematic representation of the analog circuit to be drawn. Alternately or additionally, the interface module may include a non-GUI that may receive a script or other written representation of the analog circuit.

In some embodiments, the interface module may be provided in the form of computer-executable instructions executable by a computing device, such as the processor 270, to cause the computing device to receive data for an instance of the analog circuit in a manner described above or in some other manner. The computer-executable instructions may be stored on database, a computer readable storage medium, or on some other form of static memory.

In block 406, an analog circuit simulator template of the analog circuit may be generated. The analog circuit simulator template may be configured to be used by an analog circuit simulator together with the received data to generate a value for a parameter of the parameterized HDL model. The analog circuit simulator template may include simulation information. The simulation information may include stimulus values, value measurement locations, types of analysis, and/or other simulation information that may be used by the analog circuit simulator to generate the value for the parameter of the analog circuit. In some embodiments, the analog circuit simulator template may be formed by an expert in analog circuit modeling. Alternately or additionally, the analog circuit simulator template may be stored on a database, a computer readable storage medium, or on some other form of static memory.

In some embodiments, the interface module may be further configured to receive modeling data for the instance of the analog circuit. In these and other embodiments, the analog circuit simulator template may be configured to be used by the analog circuit simulator to generate the value for the parameter based at least partially on the modeling data.

In block 408, a model constructor configured to generate a behavioral HDL model of the instance of the analog circuit based on the parameterized hardware description language model of the analog circuit and the generated value may be provided. The behavioral HDL model may be used to model the behavior of the instance of the analog circuit.

In some embodiments, the model constructor may be provided in the form of computer-executable instructions executable by a computing device to cause the computing device to generate the behavioral HDL model in a manner described above or in some other manner. The computer-executable instructions may be stored on a computer readable storage medium, a database, or on some other form of static memory.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For instance, the method 400 may further include providing a validation module configured to compare a modeled behavior of the instance of the analog circuit based on the behavioral HDL model with a modeled behavior of the schematic format of the instance of the analog circuit.

In some embodiments, the validation module may be provided in the form of computer-executable instructions executable by a computing device to cause the computing device to compare a modeled behavior of the analog circuit based on the behavioral HDL model and the generated value with a modeled behavior of the schematic format of the instance of the analog circuit based. The computer-executable instructions may be stored on a computer readable storage medium, a database, or on some other form of static memory.

In some embodiments, the method 400 may further include generating a second analog circuit simulator template of the analog circuit. The second analog circuit simulator template may be configured to be used by the analog circuit simulator to generate a second value for a second parameter of the parameterized HDL model. In some embodiments, the method 400 may further include generating an analog circuit simulator template for each group of related parameters of the parameterized HDL model so that a value may be generated for each parameter of the parameterized HDL model. In these and other embodiments, each group of related parameters may include one or more parameters and may be related in that values for each of the related parameters may be generated using a single analog circuit simulator template. In these and other embodiments, the behavioral hardware description language model may be generated based on the values generated by the analog circuit simulator templates.

In some embodiments, the generated analog circuit simulator templates may be generated by an expert in HDL modeling. Alternately or additionally, the generated analog circuit simulator templates may be stored on a database, a computer readable storage medium, or on some other form of static memory.

In some embodiments, the method 400 may further include generating a second parameterized HDL model configured to model a second analog circuit. In these and other embodiments, an analog circuit simulator template for the second analog circuit may also be generated. The analog circuit simulator template may be configured to be used by the analog circuit simulator together with the received data to generate a value for a parameter of the second parameterized HDL model. In some embodiments, the second parameterized HDL model and the analog circuit simulator template may be generated by an expert in HDL modeling. Alternately or additionally, the generated second parameterized HDL model and second analog circuit simulator template may be stored on a database, a computer readable storage medium, or on some other form of static memory.

In some embodiments, the interface module may also include a menu configured to list the analog circuit and the second analog circuit and to receive a selection of the analog circuit or of the second analog circuit. In this manner, the interface module may be configured to allow a user to select a type of analog circuit that correlates with the type of analog circuit for which instance data is received.

The embodiments described herein may include the use of a special purpose or general-purpose computer including various computer hardware or software modules, as discussed in greater detail below.

Embodiments described herein may be implemented using computer-readable media for carrying or having computer-executable instructions or data structures stored thereon. Such computer-readable media may be any available media that may be accessed by a general purpose or special purpose computer. By way of example, and not limitation, such computer-readable media may include tangible computer-readable storage media including RAM, ROM, EEPROM, CD-ROM or other optical disk storage, magnetic disk storage or other magnetic storage devices, or any other storage medium which may be used to carry or store desired program code in the form of computer-executable instructions or data structures and which may be accessed by a general purpose or special purpose computer. Combinations of the above may also be included within the scope of computer-readable media.

Computer-executable instructions comprise, for example, instructions and data that cause a general-purpose computer, special purpose computer, or special purpose-processing device to perform a certain function or group of functions. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used herein, the term "module" or "component" may refer to software objects or routines that execute on the computing system. The different components, modules, engines, and services described herein may be implemented as objects or processes that execute on the computing system (e.g., as separate threads). While the system and methods described herein are preferably implemented in software, implementations in hardware or a combination of software and hardware are also possible and contemplated. In this description, a "computing entity" may be any computing system as previously defined herein, or any module or combination of modulates running on a computing system.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

The invention claimed is:

1. A system for generating behavioral models for analog circuits, the system comprising:
    a computing system with one or more processors and memory storing a program of instructions;
    a database configured to store a parameterized hardware description language model of an analog circuit and an analog circuit simulator template of the analog circuit;
    a user interface module configured to receive data for an instance of the analog circuit in a schematic format;
    an analog circuit simulator implemented on the computing system and configured to use the received data and the analog circuit simulator template to generate a value for a parameter of the parameterized hardware description language model of the analog circuit; and
    a model constructor implemented on the computing system and configured to generate a behavioral hardware description language model of the instance of the analog circuit based on the parameterized hardware description language model of the analog circuit and the generated value.

2. The system of claim 1, wherein the database is further configured to store a second parameterized hardware description language model of a second analog circuit.

3. The system of claim 2, wherein the interface module comprises a menu configured to list the analog circuit and the second analog circuit and to receive a selection of the analog circuit or of the second analog circuit.

4. The system of claim 1, wherein the database is further configured to store a second analog circuit simulator template of the analog circuit, the analog circuit simulator being configured to use the second analog circuit simulator template to generate a second value for a second parameter of the parameterized hardware description language model.

5. The system of claim 4, wherein the behavioral hardware description language model is generated based on the second value.

6. The system of claim 1, wherein the interface module is further configured to receive modeling data for the instance of the analog circuit, the analog circuit simulator being configured to generate the value for the parameter based at least partially on the modeling data.

7. The system of claim 1, further comprising a validation module configured to compare a modeled behavior of the instance of the analog circuit based on the behavioral hardware description language model with a modeled behavior of the schematic format of the instance of the analog circuit.

8. A computer system implemented method of generating behavioral models for analog circuits, the method comprising:
    generating, using a computing system, a parameterized hardware description language model of an analog circuit;
    providing, using the computing system, a user interface module configured to receive data for an instance of the analog circuit in a schematic format;
    generating, using the computing system, an analog circuit simulator template of the analog circuit, the analog circuit simulator template configured to be used by an analog circuit simulator together with the received data to generate a value for a parameter of the parameterized hardware description language model; and
    providing, using the computing system, a model constructor configured to generate a behavioral hardware description language model of the instance of the analog circuit based on the parameterized hardware description language model of the analog circuit and the generated value.

9. The method of claim 8, further comprising generating a second parameterized hardware description language model configured to model a second analog circuit.

10. The method of claim 9, wherein the interface module comprises a menu configured to list the analog circuit and the second analog circuit and to receive a selection of the analog circuit or of the second analog circuit.

11. The method of claim 8, further comprising generating a second analog circuit simulator template of the analog circuit, the second analog circuit simulator template being configured to be used by the analog circuit simulator to generate a second value for a second parameter of the parameterized hardware description language model.

12. The method of claim 11, wherein the behavioral hardware description language model is generated based on the second value.

13. The method of claim 8, wherein the interface module is further configured to receive modeling data for the instance of the analog circuit and the analog circuit simulator template is configured to be used by the analog circuit simulator to generate the value for the parameter based at least partially on the modeling data.

14. The method of claim 8, further comprising providing a validation module configured to compare a modeled behavior of the instance of the analog circuit based on the behavioral hardware description language model with a modeled behavior of the schematic format of the instance of the analog circuit.

15. A non-transitory computer readable storage medium comprising:
    executable computer instructions to cause a system to perform operations comprising:
        receiving data for an instance of an analog circuit in a schematic format;
        generating a value for a parameter of a parameterized hardware description language model of the analog circuit based on an analog circuit simulator template of the analog circuit and the received data; and
        creating a behavioral hardware description language model of the instance of the analog circuit based on the parameterized hardware description language model and the generated value.

16. The non-transitory computer readable storage medium of claim 15, further comprising the parameterized hardware description language model of the analog circuit and the analog circuit simulator template of the analog circuit.

17. The non-transitory computer readable storage medium of claim 15, wherein the operations further comprise providing a menu configured to list the analog circuit and a second analog circuit and receiving a selection of the analog circuit or of the second analog circuit.

18. The non-transitory computer readable storage medium of claim 17, further comprising a second parameterized hardware description language model of a second analog circuit.

19. The non-transitory computer readable storage medium of claim 15, wherein the operations further comprise generating a second value for a second parameter of the parameterized hardware description language model based on a second analog circuit simulator template and the received data.

20. The non-transitory computer readable storage medium of claim 15, wherein the operations further comprise receiving modeling data for the instance of the analog circuit, wherein the value is generated based at least partially on the modeling data.

* * * * *